(12) United States Patent
Buynoski

(10) Patent No.: US 6,197,687 B1
(45) Date of Patent: Mar. 6, 2001

(54) METHOD OF PATTERNING FIELD DIELECTRIC REGIONS IN A SEMICONDUCTOR DEVICE

(75) Inventor: Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/394,869

(22) Filed: Sep. 13, 1999

(51) Int. Cl.[7] ............................................. H01L 21/44
(52) U.S. Cl. .................... 438/671; 438/717; 438/725; 438/735; 438/736
(58) Field of Search ..................... 438/585, 636, 438/669, 671, 717, 725, 735, 736, 950, 952

(56) References Cited

U.S. PATENT DOCUMENTS

| | | | |
|---|---|---|---|
| 4,616,399 | * 10/1986 | Ooka | 29/571 |
| 5,139,904 | * 8/1992 | Auda et al. | 430/30 |
| 5,472,564 | * 12/1995 | Nakamura et al. | 216/51 |
| 5,773,199 | * 6/1998 | Linliu et al. | 430/316 |
| 5,801,399 | * 9/1998 | Hattori et al. | 257/69 |
| 5,837,428 | * 11/1998 | Huang et al. | 430/313 |
| 6,046,114 | * 4/2000 | Tohda | 438/695 |

OTHER PUBLICATIONS

Wei W. Lee et al., Fabrication of 0.06 um Poly–Si Gate Using DUV Lithography With a Designed SixOyNz Film as an Arc and Hardmask, 1997 Symposium on VLSI Technology Digest of Technical Papers, pp. 31–32.*

* cited by examiner

Primary Examiner—Olik Chaudhuri
Assistant Examiner—Hoai Pham

(57) ABSTRACT

High density, multi-metal layer semiconductor devices are formed with accurate and uniform polysilicon gates and underlying gate oxides. Embodiments include etching the photoresist mask to reduce the horizontal layer.

10 Claims, 4 Drawing Sheets

METHOD OF PATTERNING FIELD DIELECTRIC REGIONS IN A SEMICONDUCTOR DEVICE

TECHNICAL FIELD

The present invention relates to a method of manufacturing a semiconductor device having accurate and uniform polysilicon gates and underlying gate oxides. The present invention is applicable to manufacturing high speed integrated circuits having submicron design features and high conductivity reliable interconnect structures.

BACKGROUND ART

Current demands for high density and performance associated with ultra large scale integration require design rules of about 0.18 microns and under, increased transistor and circuit speeds and improved reliability. As device scaling plunges into the deep sub-micron ranges, it becomes increasingly difficult to maintain performance and reliability.

Devices built on the semiconductor substrate of a wafer must be isolated. Isolation is important in the manufacture of integrated circuits which contain a plethora of devices in a single chip because improper isolation of transistors causes current leakage which, in turn, causes increased power consumption leading to increased noise between devices.

In the manufacture of conventional complementary metal oxide semiconductor (CMOS) devices, isolation regions, called field dielectric regions, e.g., field oxide regions, are formed in a semiconductor substrate of silicon dioxide by local oxidation of silicon (LOCOS) or by shallow trench isolation (STI).

Photolithography is a conventionally employed to transform complex circuit diagrams into patterns which are defined on the wafer in a succession of exposure and processing steps to form a number of superimposed layers of insulator, conductor and semiconductor materials. Scaling devices to smaller geometries increases the density of bits/chip and also increases circuit speed. The minimum feature size, i.e., the minimum line-width or line-to-line separation that can be printed on the surface, controls the number of circuits that can be placed on the chip and directly impacts circuit speed. Accordingly, the evolution of integrated circuits is closely related to and limited by photolithographic capabilities.

An optical photolithographic tool includes an ultraviolet (UV) light source, a photomask and an optical system. A wafer is covered with a photosensitive layer, called resist, because of its ability to resist chemicals used in subsequent processing. The mask is flooded with UV light and the mask pattern is imaged onto the resist by the optical system. Photoresists are organic compounds whose solubility changes when exposed to light of a certain wavelength or x-rays. The exposed regions become either more soluble or less soluble in a developer solvent.

There are, however, significant problems attendant upon the use of conventional methodology to form conductive gates with gate oxide layers in between on a semiconductor substrate. For example, when a photoresist is formed on a highly reflective surface, such as polysilicon, and exposed to monochromatic radiation, undesirable standing waves are produced as a result of interference between the reflected wave and the incoming radiation wave. In particular, standing waves are caused when the light waves propagate through a photoresist layer down to the polysilicon layer, where they are reflected back up through the photoresist. These standing waves cause the light intensity to vary periodically in a direction normal to the photoresist, thereby creating variations in the development rate along the edges of the resist and degrading image resolution. These irregular reflections make it difficult to control critical dimensions (CDs) such as linewidth and spacing of the photoresist and have a corresponding negative impact on the CD control of the shallow isolation trenches.

There are further disadvantages attendant upon the use of conventional methodologies. For example, distortions in the photoresist are further created during passage of reflected light through the highly reflective polysilicon layer which is typically used as a hardmask for etching. Specifically, normal fluctuations in the thickness of the polysilicon layer cause a wide range of varying reflectivity characteristics across the polysilicon layer, further adversely affecting the ability to maintain tight CD control of the photoresist pattern and the resulting shallow isolation trenches.

Highly reflective substrates accentuate the standing wave effects, and thus one approach to addressing the problems associated with the high reflectivity of the polysilicon layer has been to attempt to suppress such effects through the use of dyes and anti-reflective coatings below the photoresist layer. For example, an anti-reflective coating (ARC), such as a polymer film, has been formed directly on the polysilicon layer. The ARC serves to absorb most of the radiation that penetrates the photoresist thereby reducing the negative effects stemming from the underlying reflective materials during photoresist patterning. Unfortunately, use of an ARC adds significant drawbacks with respect to process complexity. To utilize an organic or inorganic ARC, the process of manufacturing the semiconductor chip must include a process step for depositing the ARC material, and also a step for prebaking the ARC before spinning the photoresist.

MOS transistors are used extensively in semiconductor integrated circuit devices. A typical MOS structure is shown in FIG. 1. The typical MOS structure 100 is formed on a semiconductor substrate 102. A source 106 region and a drain 108 region are formed in the semiconductor substrate 102. A gate oxide region 110 is formed on the semiconductor substrate 102. A polysilicon gate 112 is formed on the polysilicon gate 112 and oxide spacers 114 and 116 are formed on each side of the polysilicon gate 112. The gate length is represented by the distance 118 and is dependent upon the dimension 120 of the polysilicon gate 112. Because the strategic approach to improving the speed performance of MOS devices is to continuously reduce device dimensions, especially the gate lengths, it is necessary to decrease the polysilicon dimension 120. The evolution of MOS device technology has been governed mainly by device scaling and the feature size of the MOS gate length has been scaled down in the effort to increase the speed and scale of integration.

The problem with the further scaling of the MOS transistor gate length is the limitation of photolithography technology. The smallest feature size that photolithography technology can pattern is limited by optical diffraction. Current manufacturing lithography technology that uses UV or deep UV light as the light source is unable to pattern the polysilicon gate to achieve desired reductions in gate length.

One method that has been used to achieve dimensions below the limitations of the photolithography technology is a technique called over etching. However, it is very difficult to control the shape and the size of the structures when using the technique of over etching.

Therefore, what is needed is a method of manufacturing MOS transistors that achieves device dimensions below the limitations of photolithography.

There exists a need for a cost effective, simplified processes enabling the formation of devices which overcome the drawbacks associated with the limitations of conventional photolithography. The present invention addresses and solves the problems attendant upon conventional multi-step, time-consuming and complicated processes for manufacturing semiconductor devices utilizing conventional photolithography.

DISCLOSURE OF THE INVENTION

An advantage of the present invention is an efficient cost-effective method of manufacturing a semiconductor device with accurately formed, and reduced gate lengths.

Additional advantages of the present invention will be set forth in the description which follows, and in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises:

forming an oxide layer on a semiconductor substrate;

forming a polysilicon layer on the oxide;

forming a photoresist mask having a width on the polysilicon layer;

forming a photoactive layer on the photoresist mask;

patterning the photoactive layer and the photoresist mask to form an opening; and etching the photoresist mask to reduce the horizontal width of said mask.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

The present invention addresses and solves problems stemming from conventional methodologies of forming gate structures. Such problems include costly and time-consuming steps limited by optical diffraction effects in photolithography technology.

The present invention constitutes an improvement over conventional practices in forming gate structures. The present invention enables the formation of gate structures with accurately controlled and reduced critical dimensions. In accordance with embodiments of the present invention, the semiconductor device can be formed by: forming an oxide layer on a semiconductor substrate; forming a polysilicon layer on the oxide; forming a photoresist mask having a width on the polysilicon layer; forming a photoactive layer on the photoresist mask; patterning the photoactive layer and the photoresist mask to form an opening; and etching the photoresist mask to reduce the horizontal width of said mask.

Embodiments of the present invention include reducing the horizontal width of the photoresist mask to about 90 nm to about 110 nm.

Interconnect members formed in accordance with embodiments of the present invention can be, but are not limited to, interconnects formed by damascene technology. Given the present disclosure and the objectives of the present invention, the conditions during which the photoactive layer are formed can be optimized in a particular situation.

An embodiment of the present invention is schematically illustrated in FIGS. 2A–2F. Adverting to FIG. 2A, a wafer 204 comprising a semiconductor substrate, such as silicon, is provided. A gate oxide layer 202, comprising an oxide, e.g., silicon dioxide, is deposited on the substrate, as by subjecting the water to an oxidizing ambient at elevated temperature.

Figure 1:
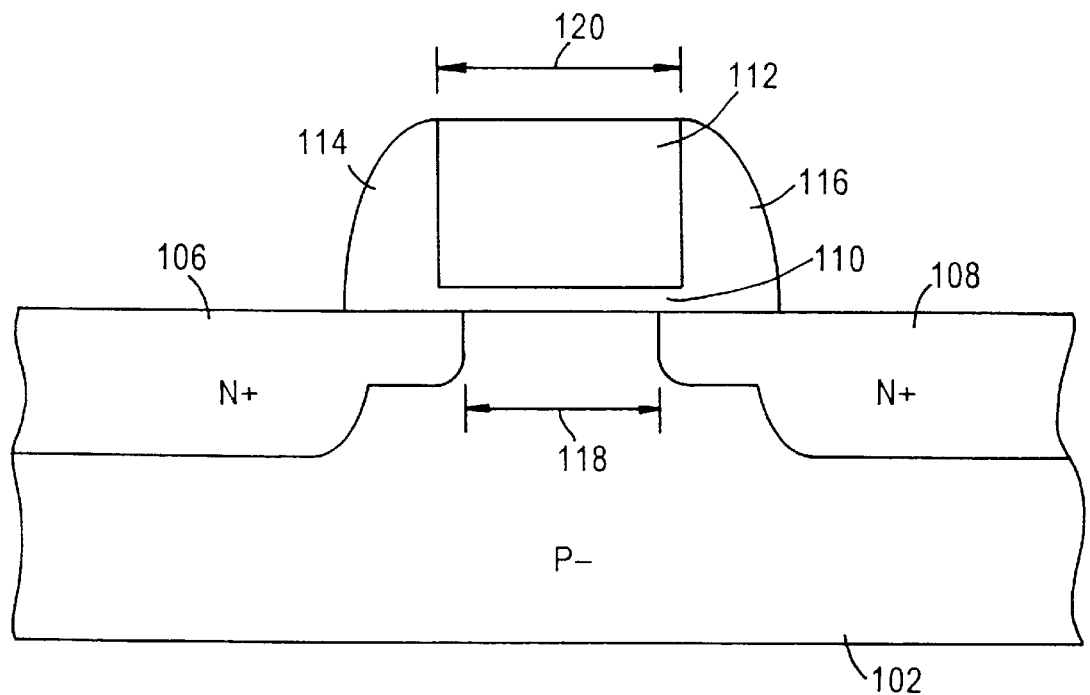
FIG. 1 schematically illustrates a typical MOS structure.
Figure 2A:
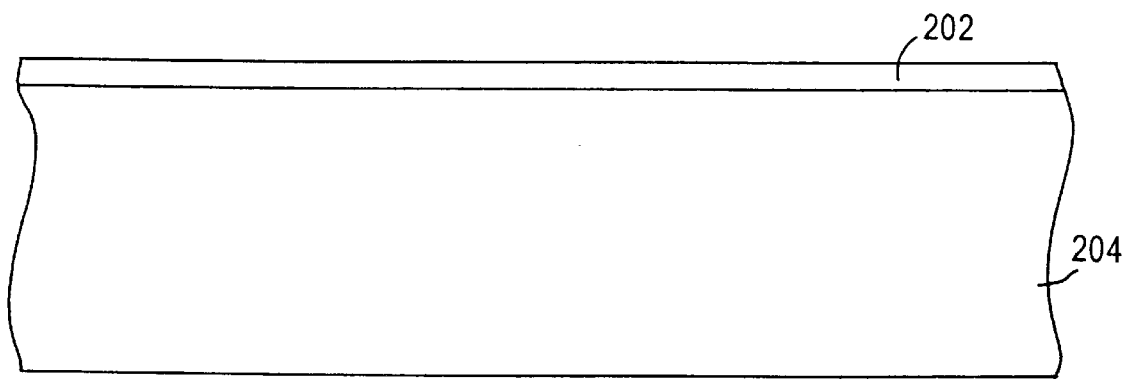
FIGS. 2A–2F schematically illustrate sequential phases of a method in accordance with an embodiment of the present invention.
Figure 2B:
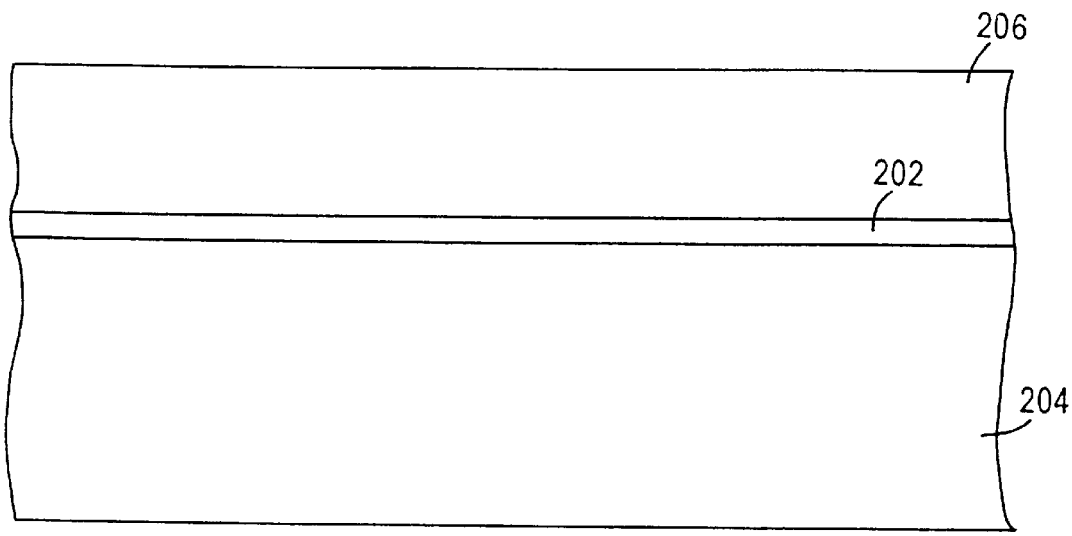

With reference to FIG. 2B, a polysilicon layer 206, is deposited on the gate oxide layer 202 by placing the oxidized substrate in a chamber. Optionally, an antireflective coating (ARC) is formed on the polysilicon layer (not shown).

Figure 2C:
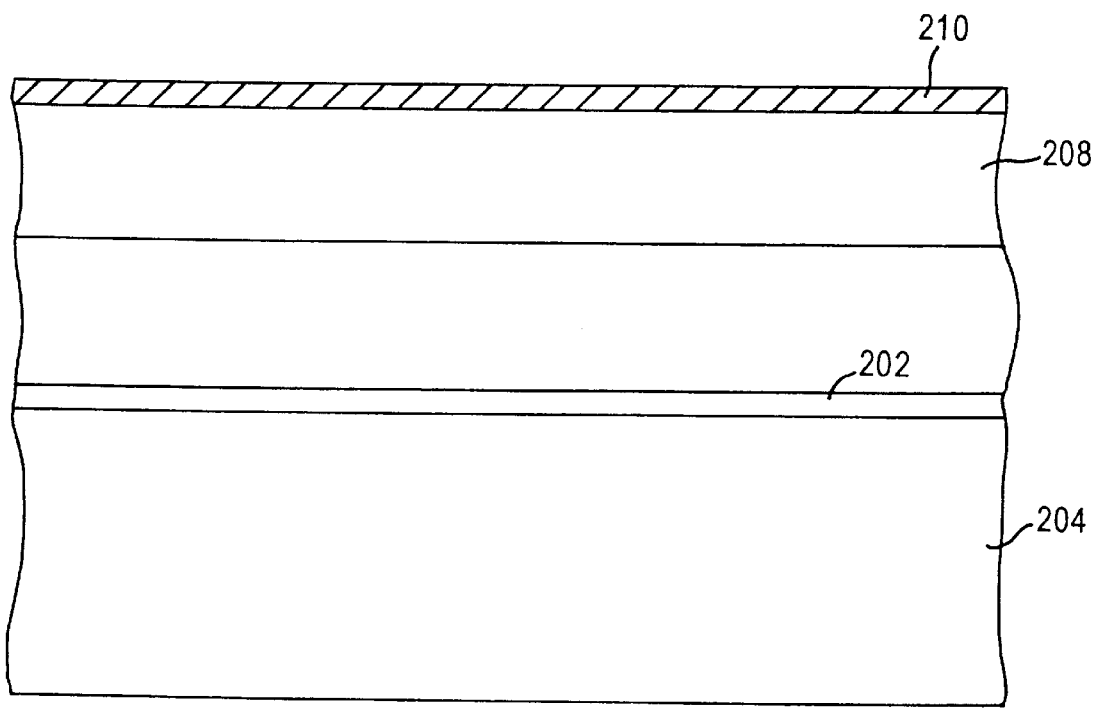

With reference to FIG. 2C, a photoresist mask 208 is formed on the polysilicon layer 206. Photoresist mask 208 can comprise any of a variety of conventional photoresist materials which are suitable to be patterned using photolithography.

With continued reference to FIG. 2C, a photoactive layer 210 is formed on the photoresist mask 208. Embodiments of the present invention comprise forming the photoactive layer to a thickness of about 100 A to about 1500 A, such as about 500 A to about 1000 A. Photoactive layer 210 can comprise any of a variety of materials that have the same etch rate or a slower etch rate than the underlying photoresist mask.

Figure 2D:
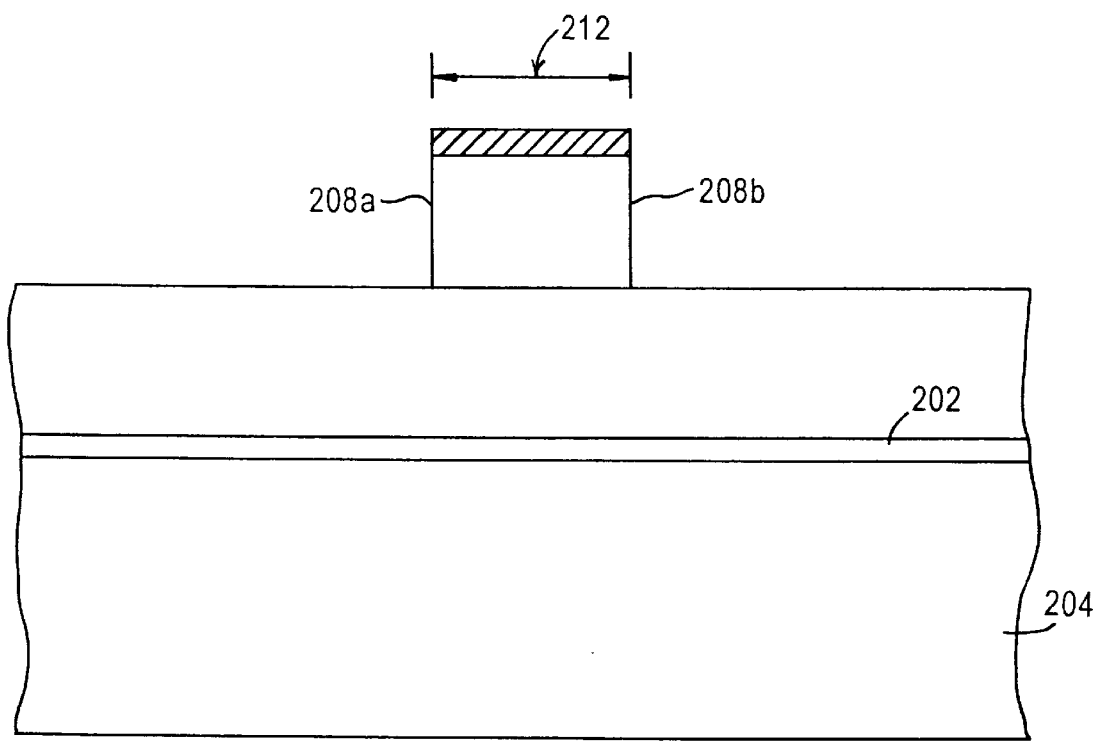

With reference to FIG. 2D, the photoactive layer 208 and the photoresist mask 206 are patterned, by conventional methodology, resulting in a patterned mask having side surfaces 208a and 208b. Line 212 indicates the original boundary of the photoresist mask and represents the minimum dimension available from photolithography technology because of optical diffraction. Line 214 indicates the final boundary of the photoresist mask and represents the minimum dimension available from the methodology of the present invention.

Figure 2E:
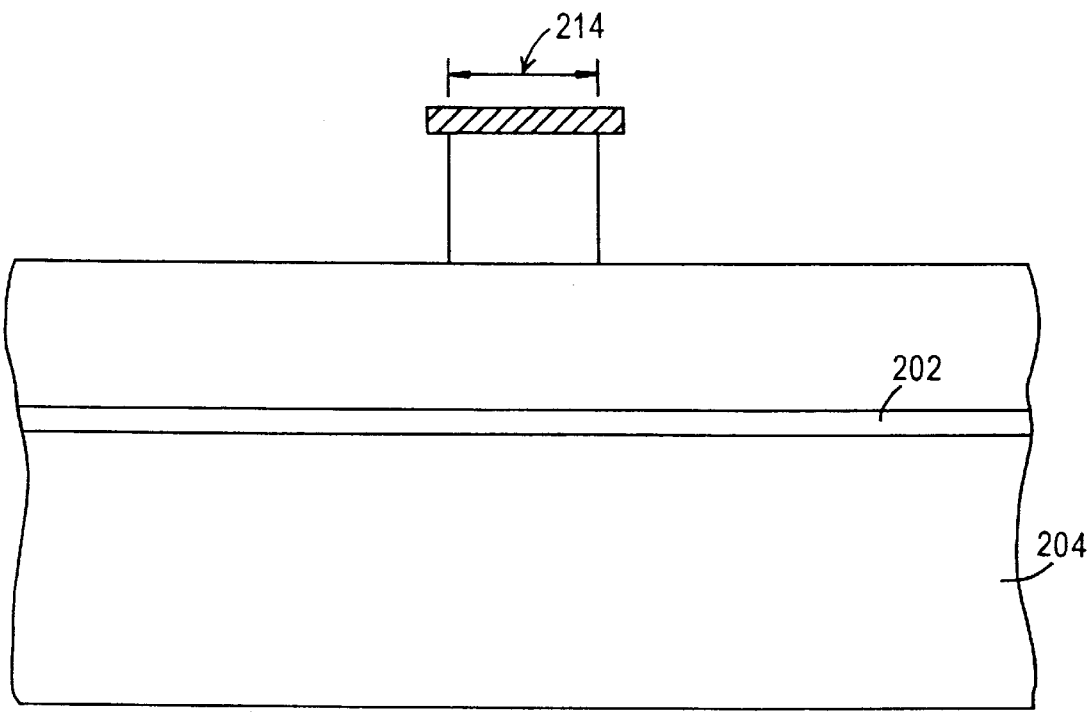

Adverting to FIG. 2E, plasma etching of the photoresist mask is conducted to selectively remove portions of side surfaces 208a and 208b. Given the present disclosure and the objectives of the present invention, the conditions during which vertical photoresist is etched can be optimized in a particular situation. For example, the invention can be practiced by etching in a chamber by introducing a gas comprising hydrogen bromide (HBr), oxygen ($O_2$) and Argon (Ar) in a chamber for about 20 seconds at a pressure of about 3 milliTorr. Given the stated objective, one having ordinary skill in the art can easily optimize temperature, gas flow as well as other process parameters for a given situation.

Figure 2F:
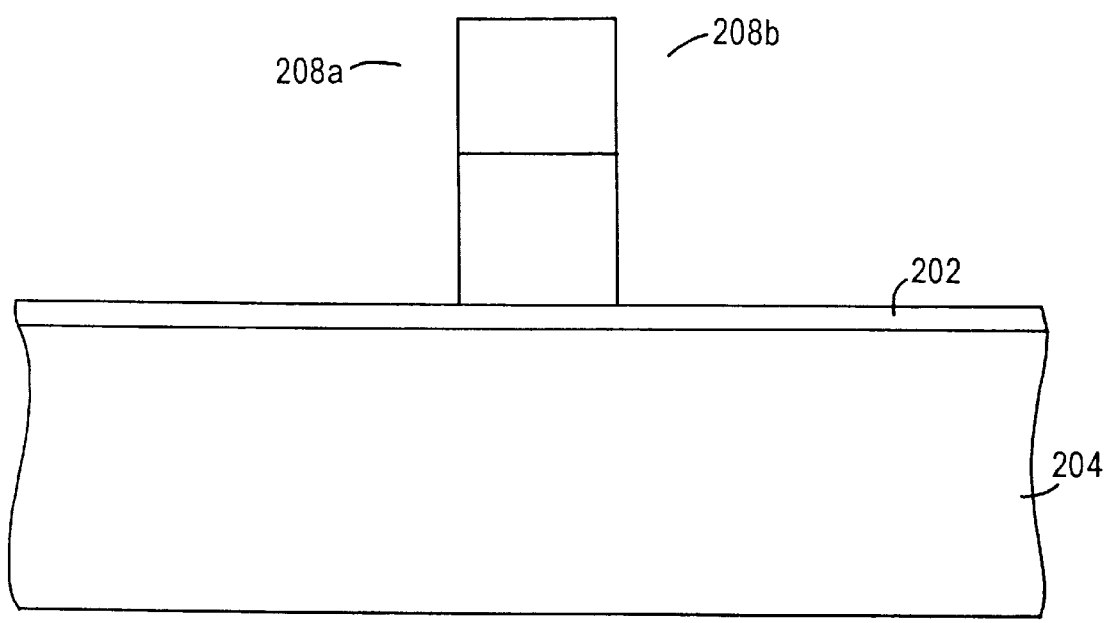

Adverting to FIG. 2F, the photoresist mask and optionally the underlying antireflective coating (not shown), and the unprotected polysilicon layer are stripped from the substrate utilizing conventional etching techniques. With continued reference to FIG. 2F, a conductive polysilicon gate remains on the substrate with a gate oxide layer in between. At this point, the wafer continues to the next stage in the overall manufacturing process. Subsequent conventional processing steps, though not illustrated, typically include; forming dielectric spacers on sidewalls of the gate; and forming source/drain regions on either side of the gate by implantation of impurities.

In accordance with the present invention, various structures are formed in an elegantly simplied, efficient and cost-effective manner. Advantageously, the photoactive coating layer prevents erosion of the photoresist mask during the vertical resist trim and the negative effects stemming therefrom during photoresist patterning. The photoactive coating layer formed in accordance with the present invention is particularly advantageous in forming interconnection patterns, particularly in various types of semiconductor devices having sub-micron features and high aspect ratios.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming an oxide layer on a semiconductor substrate;

forming a polysilicon layer on the oxide;

forming a layer stack consisting of a lower relatively thick photoresist mask and an upper relatively thinner coextensive photoactive layer, the photoactive layer having a thickness of about 500 A to about 1000 A;

patterning the photoactive layer and the photoresist mask to form a pillar; and etching the photoresist mask to reduce the horizontal width of said mask.

2. The method according to claim 1, comprising:

forming an antireflective coating (ARC) on the polysilicon layer.

3. The method according to claim 1, comprising:

reducing the horizontal width of the photoresist mask to about 90 nm to about 110 nm.

4. The method according to claim 1, comprising:

reducing the horizontal width of the photoresist mask to about 70 nm to about 100 nm.

5. The method according to claim 1, comprising:

forming the photoactive layer with an etch rate slower than or equal to the photoresist mask.

6. The method according to claim 1, comprising:

etching the photoresist mask by introducing a gas comprising hydrogen bromide (HBr), oxygen ($O_2$) and Argon (Ar) in a chamber for about 20 seconds at a pressure of about 3 milliTorr.

7. The method according to claim 1, further comprising:

etching the polysilicon layer.

8. The method according to claim 7, further comprising:

etching the photoresist mask to reduce the horizontal width of said mask, and etching the polysilicon layer in the same chamber.

9. The method according to claim 1, further comprising:

etching the oxide layer; and removing the photoactive layer and the photoresist mask.

10. The method according to claim 1, further comprising:

forming dielectric spacers on sidewalls of the gate; and forming source drain regions on either side of the gate by implantation of impurities.

* * * * *